United States Patent [19]
Nakase et al.

[11] Patent Number: 4,757,277
[45] Date of Patent: Jul. 12, 1988

[54] COMPENSATING AMPLIFIER FOR AUTOMOBILE ANTENNA

[75] Inventors: Kazuhiko Nakase, Tokyo; Shuki Satoh, Kawasaki, both of Japan

[73] Assignee: Harada Kogyo Kabushiki Kaisha, Tokyo, Japan

[21] Appl. No.: 906,757

[22] Filed: Sep. 11, 1986

[30] Foreign Application Priority Data

Oct. 14, 1985 [JP] Japan ................................ 60-228256

[51] Int. Cl.⁴ ...................... H03F 3/189; H04B 1/18
[52] U.S. Cl. .................................. 330/306; 455/286; 455/292; 455/293
[58] Field of Search ............... 330/306; 343/711–713, 343/825, 843; 455/142–144, 193, 278, 283, 286, 287, 293, 292

[56] References Cited

U.S. PATENT DOCUMENTS 1,738,274  12/1929  Anderson ................... 455/292 X
4,157,547   6/1979  Freimark et al. ........... 455/142 X

FOREIGN PATENT DOCUMENTS 67734   4/1984  Japan ........................... 455/193

*Primary Examiner*—James B. Mullins
*Attorney, Agent, or Firm*—Koda and Androlia

[57] ABSTRACT

A compensating amplifier for an automobile antenna which is relatively short and free from interference from high frequency band television signals. The amplifier includes an inductive element in a primary serial tuning circuit of a multiple tuning circuit of an antenna which is connected in parallel to a condenser, and the parallel resonant frequency of a parallel circuit which is formed by the inductive element and the condenser is set at approximately the same resonant frequency as the resonant frequency of the antenna.

3 Claims, 2 Drawing Sheets

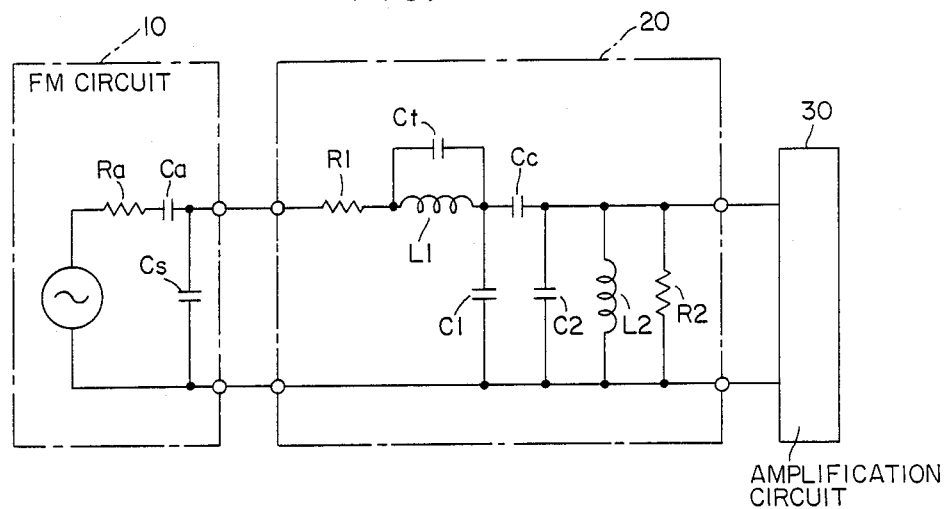
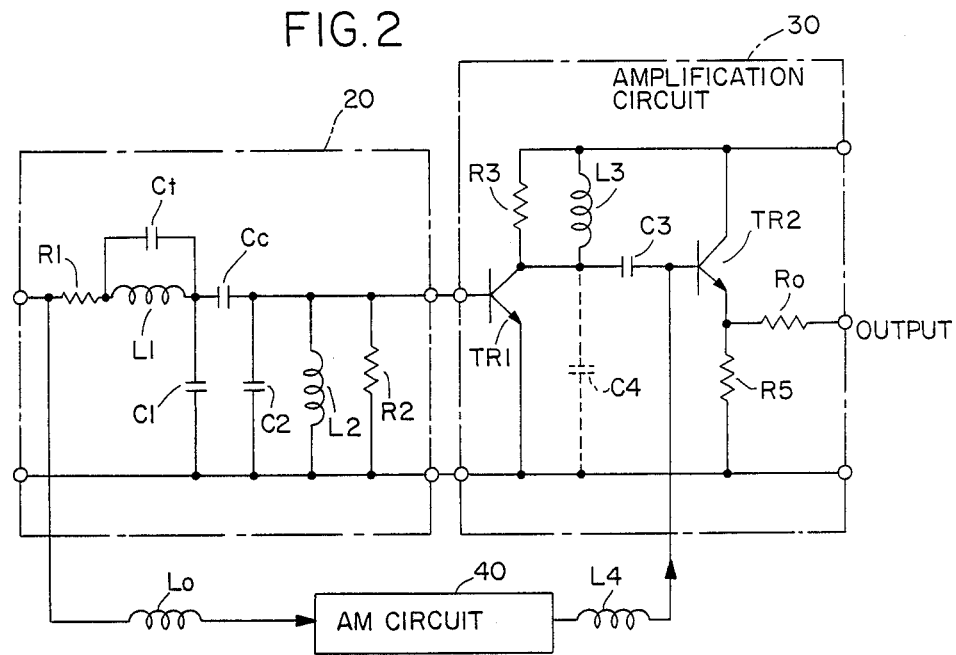

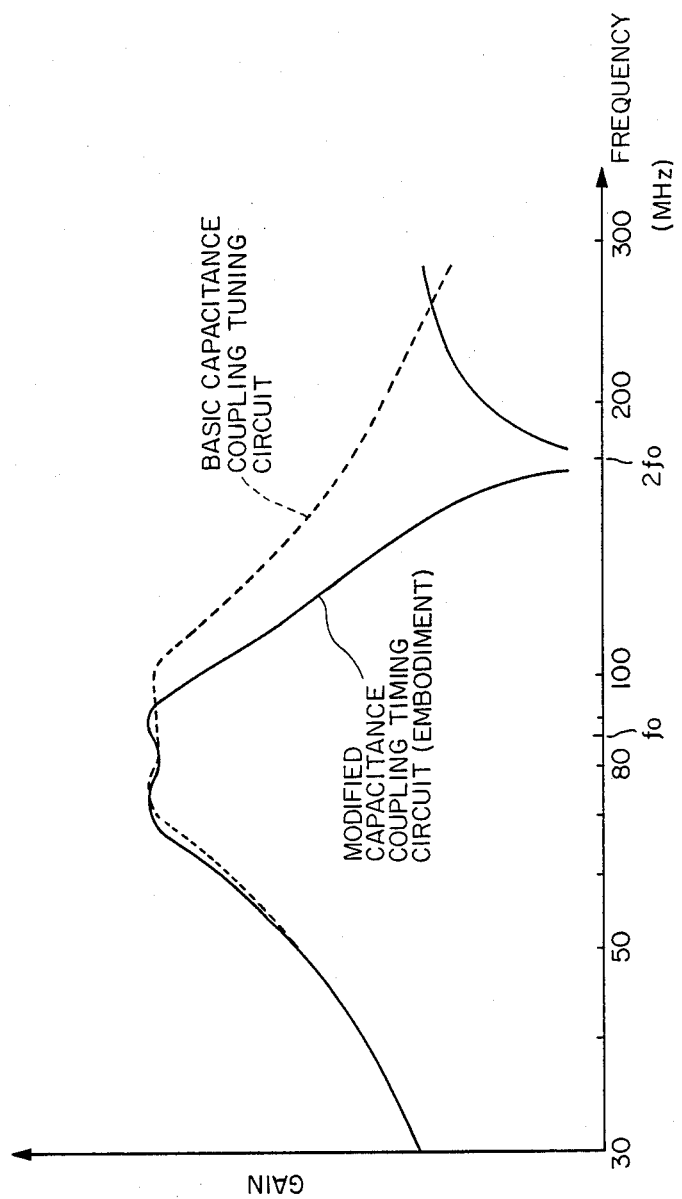

COMPENSATING AMPLIFIER FOR AUTOMOBILE ANTENNA

BACKGROUND OF THE INVENTION

1. Field of the Invention

The present invention relates to a compensating amplifier, and more particularly to a compensating amplifier which reduces the influence of interference waves in an AM/FM automobile antenna.

2. Prior Art

In automobile antennas for receiving AM/FM waves, the most widely used antennas have a length which causes FM waves to be in a constant condition, which is 0.8 m to 1.0 m.

When an antenna of this length is used in a regular passenger car, the top of the antenna reaches much higher than the automobile body. Because of this, the antenna sometime hits the garage ceiling, etc. and is damaged. Accordingly, an antenna which is shorter than the conventional antenna and is free from the above problems is more desirable.

However, when the antenna is shortened in length by half, the resonant frequency of the antenna becomes the same as high frequency bands (170 MHz–222 MHz) of television signals. Thus, the antenna's sensitivity within this frequency becomes greater. In addition, since the output of television transmissions is often very strong, the high channel signals of the television signal disturb FM signal reception.

SUMMARY OF THE INVENTION

The present invention is obtained as a result of an effort to solve the above mentioned problems. Therefore, it is a primary object of the present invention to provide a compensation amplifier for a short automobile antenna making it free from any disturbance caused by the high frequency band of television.

In keeping with the principles of this invention, the objects of the present invention are accomplished by a unique structure for a compensation amplifier for automobile antennas wherein an inductive element in a primary serial tuning circuit of a multiple tuning circuit of an antenna and condenser are connected in parallel so that the parallel resonant frequency of the parallel circuit which is formed with the inductive element and the condenser is set to approximately the same resonant frequency as the resonant frequency of the antenna.

BRIEF DESCRIPTION OF THE DRAWINGS

The above mentioned features and objects of the present invention will become more apparent with reference to the following description taken in conjunction with the accompanying drawings, wherein like reference numerals denote like elements, and in which:

FIG. 1 is a circuit diagram showing a double tuning circuit which is an embodiment of the present invention;

FIG. 2 is a circuit diagram showing in concrete form an example of a double tuning circuit and amplification circuit;

FIG. 3 is a diagram showing frequency/amplitude characteristics in each capacitance coupling double tuning circuit and modified capacitance coupling double tuning circuit;

DETAILED DESCRIPTION OF THE INVENTION

FIG. 1 is a circuit diagram showing a double tuning circuit, which is one of the embodiments of the present invention.

An FM antenna 10 is of approximately half the length of conventional antennas, that is, it is about 30–60 cm. An equivalent circuit of the FM antenna 10 comprises an equivalent antenna resistance Ra, an equivalent antenna electrostatic capacity Ca, and floating capacity Cs which includes the antenna base and compensating amplification input. The tuning frequency of this FM antenna 10 is within the high frequency band of television, which is 170 MHz–222 MHz.

A double tuning circuit 20 is a main component of the compensating amplifier for the antenna and is basically a capacitive coupling tuning circuit. The circuit 20 includes a primary serial tuning circuit, a secondary tuning circuit and a coupling condenser. The primary serial tuning circuit comprises an inductive element L1, a condenser C1 and a resistance R1. The secondary tuning circuit comprises an inductive element L2, a condenser C2 and resistance R2. The coupling condenser is Cc in the drawing. The frequency/amplitude characteristics of the basic capacitive coupling tuning circuit is shown in FIG. 3 by the dotted line and is symmetric, centering around the tuning frequency fo.

In this embodiment, the primary serial tuning circuit of the double tuning circuit 20 further includes a small capacitance condenser Ct which is in parallel to the inductive element L1. The capacitance of the condenser Ct is selected so that the parallel resonant frequency of the parallel circuit, which is formed with the inductive element L1 and condenser Ct, is set at approximately 2 fo. In this case, the parallel resonant frequency 2 fo is almost the same as the resonant frequency of the FM antenna 10. The frequency/amplitude characteristics of the thus modified capacitance coupling double tuning circuit is shown by the solid line in FIG. 3.

The primary serial tuning circuit which includes the resistance R1, the inductive element L1 and the condenser C1 is kept tuned as is the antenna capacitance (capacitance of the condenser Ca and Cs) of the antenna 10.

FIG. 2 is a circuit diagram specifically showing an example of the double tuning circuit and amplification circuit.

The double tuning circuit 20 shown in FIG. 2 is the same as that in FIG. 1.

Am amplifying circuit 30 includes an inductive element L3 which broadly resonates in the FM frequency band, a resistance R3, a condenser C3 for stopping AM waves, a resistance Ro which is a matching resistance to a coaxial feeding cable and transistors TR1 and TR2. The circuit 30 further includes an inductive element Lo which stops FM waves, an AM circuit 40, and an inductive element L4 which stops FM waves.

In the disclosed embodiments, of the several signals received by the FM antenna, which is half the length of a regular antenna, a high frequency signal which is higher than the FM frequency is stopped by the inductive element Lo. Thus, it does not reach the AM circuit 40 and enters into the double tuning circuit 20. In this case, since the resonant frequency of the FM antenna 10 is about the same as that of the high frequency band of television, of the several input signals for the double tuning circuit 20, the signal level of the television high frequency signals is the highest. However, since the resonant frequency of the parallel resonance circuit which includes the inductive element L1 of the primary side and the condenser Ct is about the same as the resonant frequency of the FM antenna 10, the signal components of television high frequency signals are greatly attenuated in the parallel resonant circuit.

Furthermore, the primary serial tuning circuit which includes R1, L1 and C1 is tuned along with the antenna capacitance of the antenna 10. Thus, the reactive loss by the floating capacitance Cs of the antenna 10 can be decreased.

Now, since the FM antenna 10 is about half the length of a regular antenna, the capacitance reactance element would seem to be increased within the FM frequency band, resulting in a sensitivity decrease. Because of this, the matching loss to feeding cables should increase. However, since the output circuit of the compensating amplifier is matched to the characteristic impedance Zo of a coaxial feeding cable by an emitter follower, the matching loss can be reduced.

In the above embodiment, the amplifier is described with reference to the short antenna 10. It can be applied to a windshield antenna and effectively eliminates the interference waves. Instead of the double tuning circuit 20, a multiple tuning circuit, such as triple or more, may be employed for the same purpose. As a multiple tuning circuit, an electromagnetic inductive coupling circuit can be employed to replace the capacitance coupling.

As described in detail in the above, according to the present invention, an automobile antenna which is shorter than conventional FM antennas can be made to be totally free from any interference caused by the signals of the high frequency bands of television.

We claim:

1. A compensating amplifier for an automobile antenna, said amplifier being characterized by a multiple tuning circuit having a primary serial tuning circuit and a secondary tuning circuit coupled between said amplifier and said antenna, an inductive element of said primary serial tuning circuit of said multiple tuning circuit and a condenser of said multiple tuning circuit are connected in parallel, and a parallel resonant frequency of said parallel circuit, which comprises said inductive element and said condenser, is set at approximately the same frequency as a resonant frequency of said antenna.

2. A compensating amplifier according to claim 1, wherein interference by signals of a television high frequency band is eliminated by setting the resonant frequency of said antenna within said high frequency band of televisions signals.

3. An amplifier according to claim 1, wherein said multiple tuning circuit is formed so as to include the capacity of said antenna.

* * * * *